United States Patent
Patel

[19]

[11] Patent Number: 6,163,073

[45] Date of Patent: Dec. 19, 2000

[54] INTEGRATED HEATSINK AND HEATPIPE

[75] Inventor: Janak G. Patel, South Burlington, Vt.

[73] Assignee: International Business Machines Corporation, Armonk, N.Y.

[21] Appl. No.: 09/062,470

[22] Filed: Apr. 17, 1998

[51] Int. Cl.[7] .............................. H01L 23/34; H01B 7/34; F28D 15/00

[52] U.S. Cl. ..................... 257/712; 257/722; 174/15.2; 165/104.33

[58] Field of Search ................... 257/712, 715, 257/722; 165/104.33; 174/15.2

[56] References Cited

U.S. PATENT DOCUMENTS

| | | | |
|---|---|---|---|
| 4,204,246 | 5/1980 | Arii et al. ............................... | 361/385 |
| 4,727,455 | 2/1988 | Neidig et al. ........................... | 361/385 |
| 4,833,567 | 5/1989 | Saaski et al. ........................... | 361/385 |
| 5,115,858 | 5/1992 | Fitch et al. ............................. | 361/385 |
| 5,181,167 | 1/1993 | Davidson et al. ...................... | 361/385 |
| 5,199,483 | 4/1993 | Bahng ..................................... | 165/1 |
| 5,268,812 | 12/1993 | Conte ..................................... | 361/698 |
| 5,309,457 | 5/1994 | Minch ..................................... | 372/34 |
| 5,329,993 | 7/1994 | Ettehadieh ............................. | 361/700 |
| 5,355,942 | 10/1994 | Conte ..................................... | 257/700 |
| 5,424,916 | 6/1995 | Martin .................................... | 361/689 |
| 5,453,911 | 9/1995 | Wolgemuth ............................. | 361/689 |
| 5,491,362 | 2/1996 | Hamzehdoost ......................... | 257/712 |
| 5,495,889 | 3/1996 | Dubelloy ................................ | 257/719 |
| 5,725,050 | 3/1998 | Meyer, IV et al. .................... | 257/727 |
| 5,826,645 | 10/1998 | Meyer, IV et al. .................... | 257/719 |

*Primary Examiner*—Mahshid Saadat
*Assistant Examiner*—Jhihan B. Clark
*Attorney, Agent, or Firm*—James M. Lee

[57] ABSTRACT

A heatsink mounted to an electronic device having an area substantially greater than that of the device includes a heatpipe in the heatsink for transferring heat within the heatsink to reduce thermal gradients therein.

20 Claims, 5 Drawing Sheets

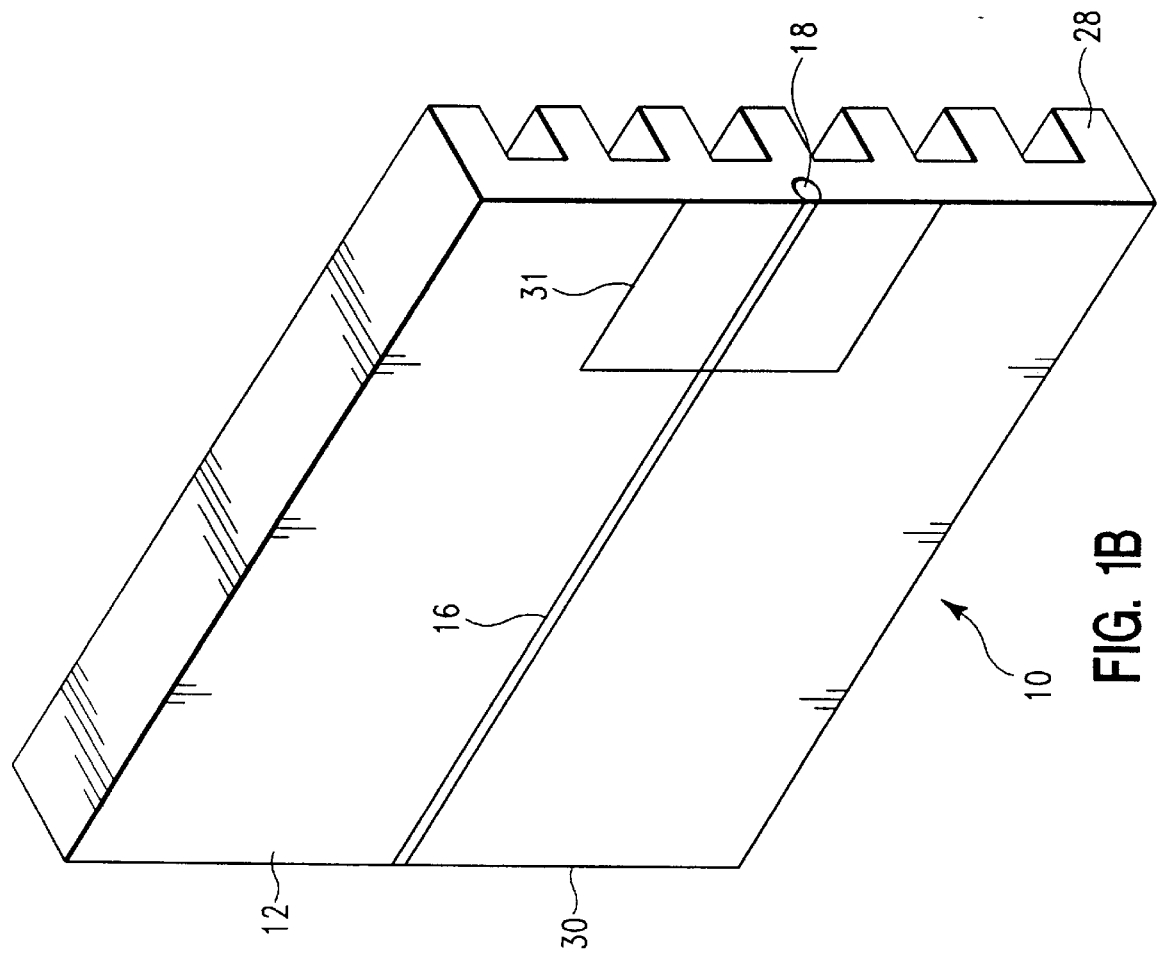
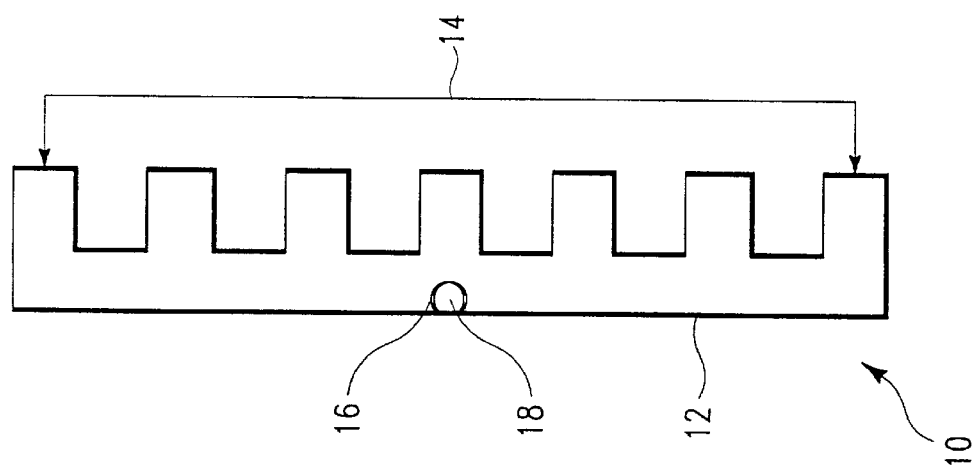

INTEGRATED HEATSINK AND HEATPIPE

FIELD OF INVENTION

This invention relates to a multimode heatsink for an electronic module which mounts to a printed circuit board.

BACKGROUND OF INVENTION

Present day electronic devices require special provisions for removing heat. Some prior art examples include adding heatsinks and other thermally conductive structures to the electronic device. It is also known to have air cooling for structures containing electronic devices.

More recently heatpipes have been employed to transfer heat from the device to a remote location where the heat is then removed by a heatsink, a fan, or any other appropriate device.

The cooling requirement, available physical space for the cooling solution, cost of the solution and the reliability requirement of the solution help determine the type of external cooling solution. Where the reliability and the cost of the cooling solution are the most important criteria for an application, a heatsink is an ideal candidate. It has been found, however, that when cooling requirements are stringent and available physical space is constrained in the height or z direction, a large thin heatsink is inadequate. Heatpipes have not found universal application because the heatpipe merely transfers the heat but does not dissipate the heat.

SUMMARY OF INVENTION

It is an object of the present invention to efficiently transfer heat from a heat source to all portions of a heatsink for more efficient dissipation. It is a further object of this invention to improve upon heatsinks by eliminating variation in temperature over the heatsink.

More specifically, it is an object of this invention to provide a heatpipe within a heatsink to efficiently transfer heat within the heatsink and to improve reliability and thermal performance.

BRIEF DESCRIPTION OF THE DRAWINGS

Other objects, features and advantages will occur to those skilled in the art from the following description of preferred embodiments and the accompanying drawings in which:

FIG. 1A is a cross-sectional view of the heatsink of FIG. 1;

FIG. 1B is a three dimensional view showing the side of the heatsink that is mounted to the electronic module;

DESCRIPTION OF THE INVENTION

Figure 1:
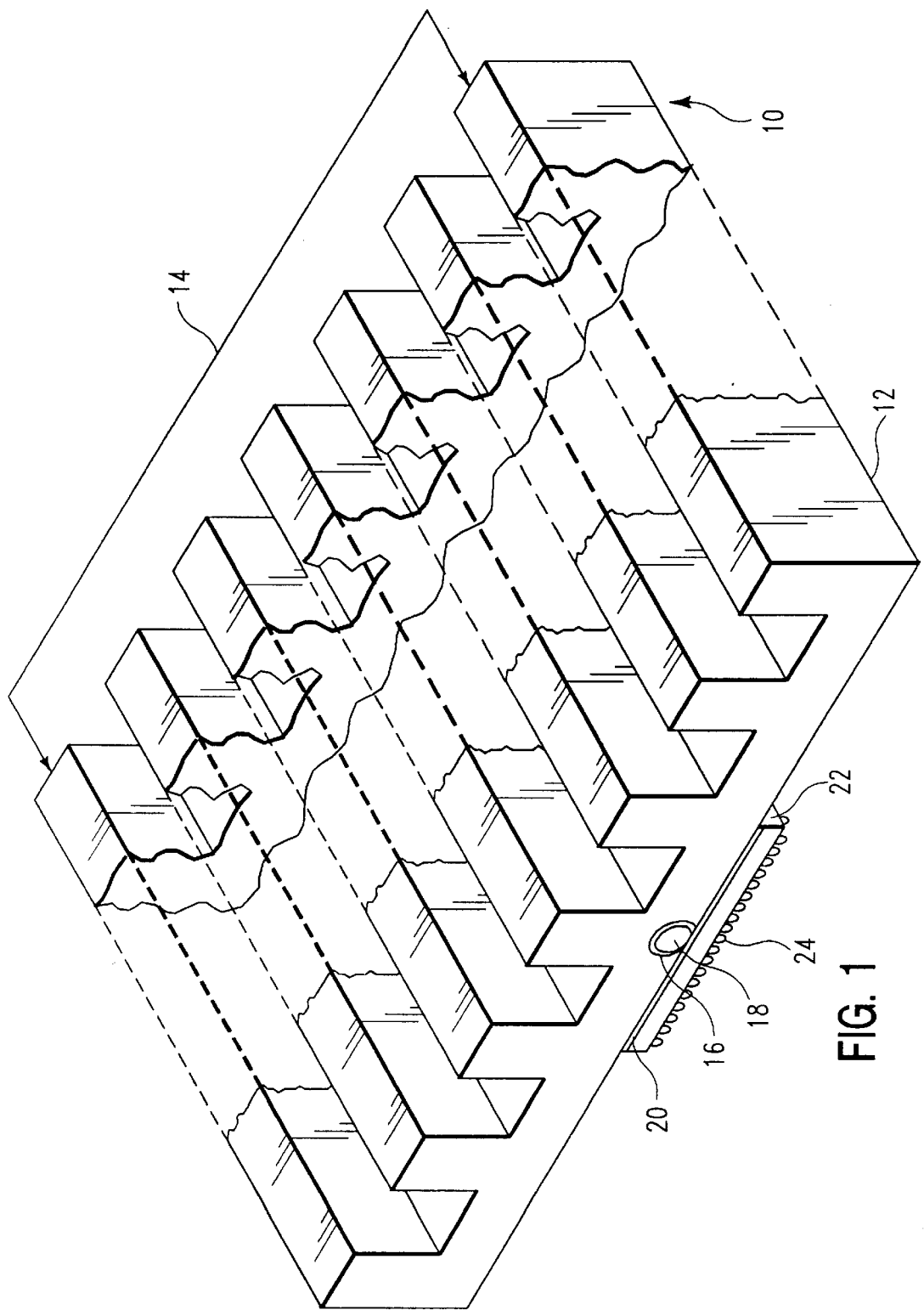
FIG. 1 is a three dimensional view of a heatsink mounted to an electronic module according to the present invention.

With more specific regard now to FIG. 1, there is shown a heatsink 10 having a base 12 and fins 14 for heat dissipation. Within the base 12 a groove 16 is formed providing a channel within which a heatpipe 18 is located. In this embodiment the heatsink 10 and heatpipe 18 are attached by a thermal adhesive 20 to an electronic module 22 having pins 24 for connecting to a printed circuit board 26 (see FIG. 2). Electronic module 22 is a packaged integrated chip. It could also be an IC chip or discrete power component directly attached to heatsink 10 and heatpipe 18.

As seen in FIG. 1A the groove 16 in the base 12 is sized to allow the heatpipe 18 to contact the module 22 (FIG. 1) along the plane of base 12 via the adhesive layer 20 (FIG. 1). FIG. 1B shows the groove 16, extending from edge 28 to edge 30 of the heatsink 10. Area 31 is the area of contact between heatsink 16 and module 22. Heatpipe 18 transfers heat within heatsink 10 from area 31 to distant portions of heatsink 10 to reduce thermal gradients and provide more efficient cooling of module 22.

Figure 2:
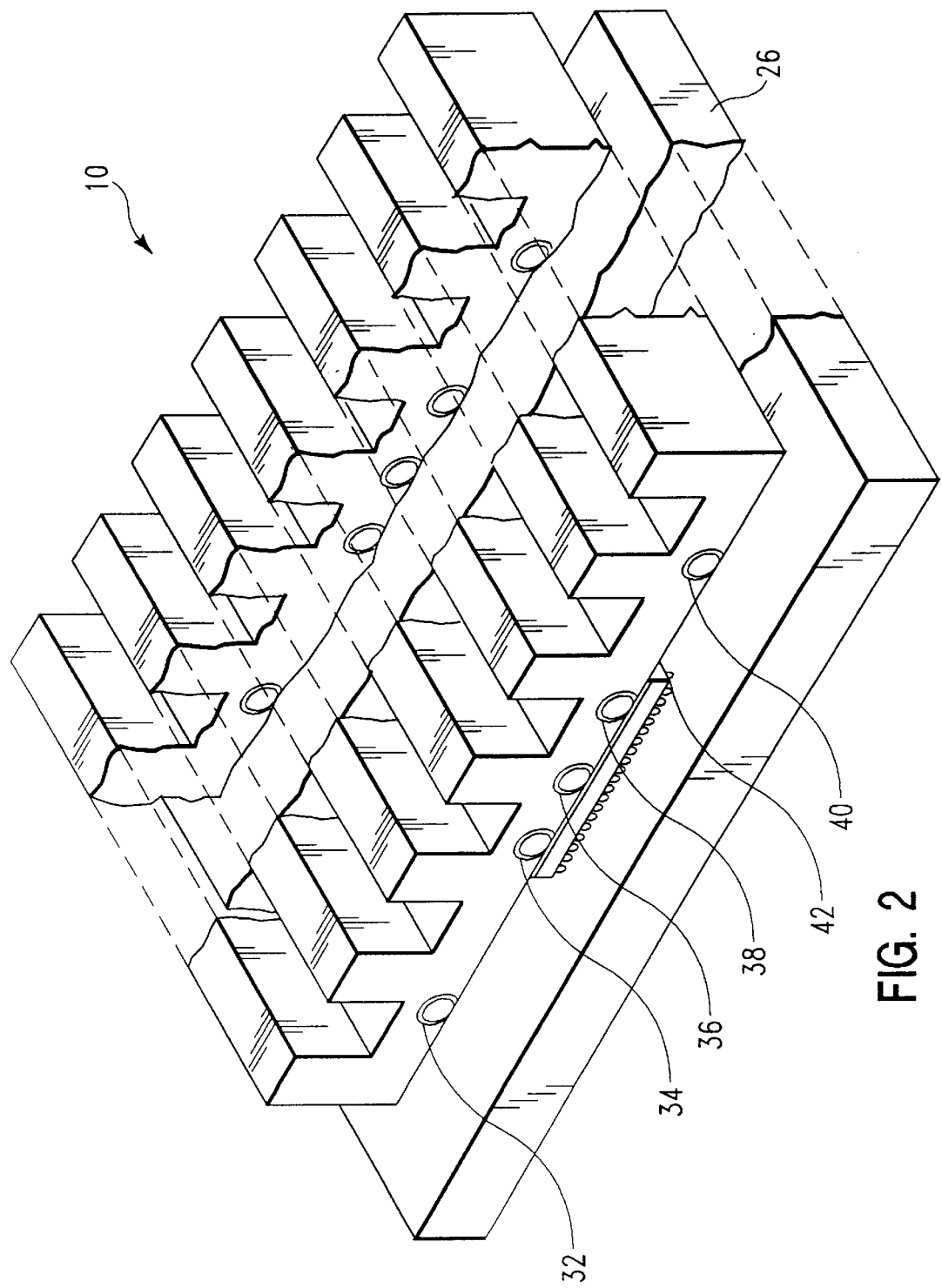
FIG. 2 is a three dimensional view of a heatsink having several heatpipes and mounted to an electronic module which is mounted on a printed circuit board.

Referring now to FIG. 2, there is shown another embodiment of this invention having several grooves 32, 34, 36, 38 and 40 for heatpipes, three of which are in contact with module 42. Module 42 is electrically connected to printed circuit board 26.

Figure 3:
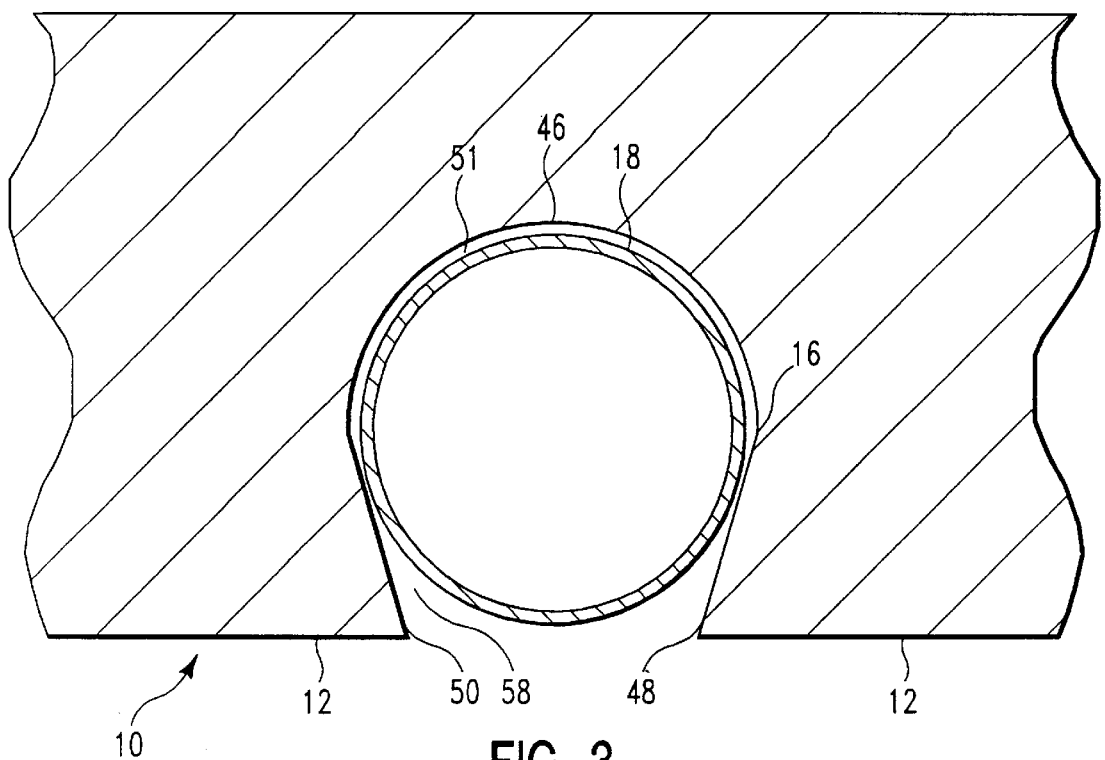
FIG. 3 is a partial cross section of the heatsink of FIG. 1 showing the groove therein for the heatpipe according to the present invention.
Figure 5:
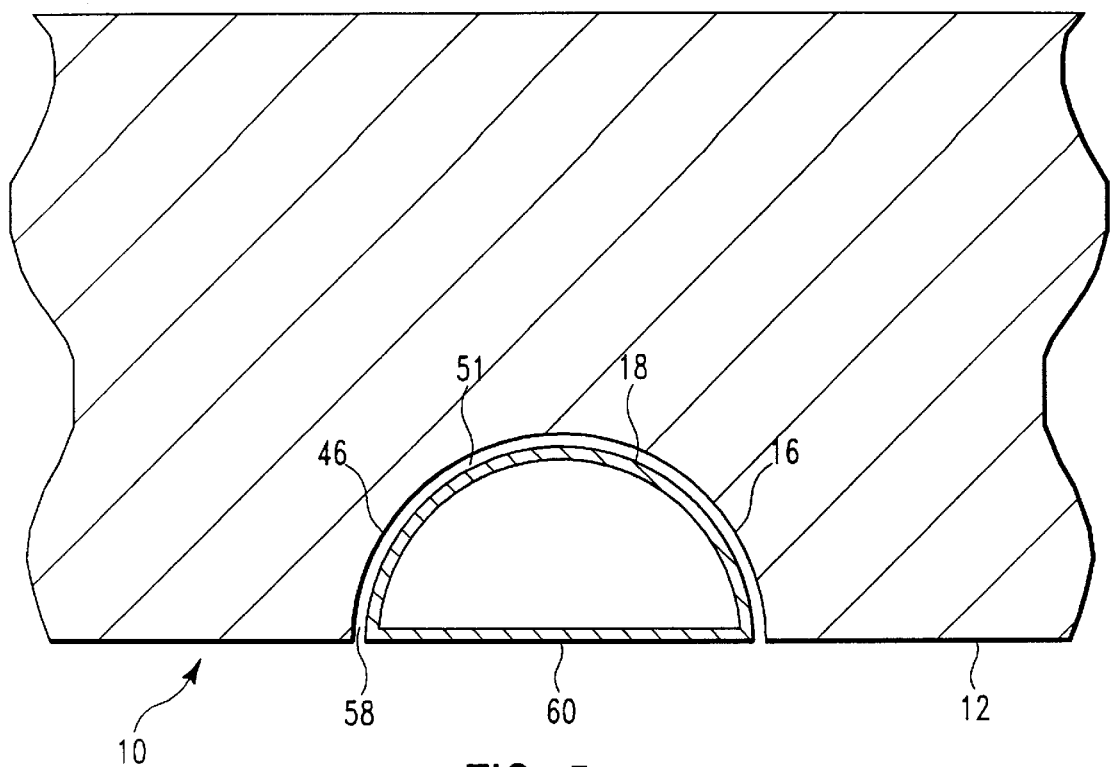
FIG. 5 is a partial cross section of the heatsink in which the heatpipe is flat or flattened to improve thermal contact with the module.

In one embodiment, shown in FIG. 3, the groove 16 (or groove 32, 34, 36, 38, 40) is formed by an arcuate wall 46 and converging walls 48 and 50. In this groove construction the heatpipe 18 will rest on module 22 in the plane of base 12 (FIG. 1). Space 51 between heatpipe 18 and walls 46, 48, and 50 is filled with thermally conducting adhesive 58 to facilitate heat transfer from heatpipe 18 to heatsink 10. Groove 16 is made only slightly larger than heatpipe 18 to further facilitate heat transfer. Preferably groove 16 is sized so that at least ½ of the surface area of heatpipe 18 is in initimate contact with groove 16 to provide efficient heat transfer between heatpipe and heatsink. If groove 16 is made shallower than the diameter of heatpipe 18, in mounting module 22 to heatsink 10 heatpipe 18 will be flattened, increasing the area of contact 60 between module 22 and heatpipe 18 in the region where module 22 is located, as shown in FIG. 5. This improves heat transfer by providing a larger area of contact between module 22 and heatpipe 18 and more direct contact between heatpipe 18 and heatsink 10 along arcuate wall 50 of groove 16.

Figure 6:
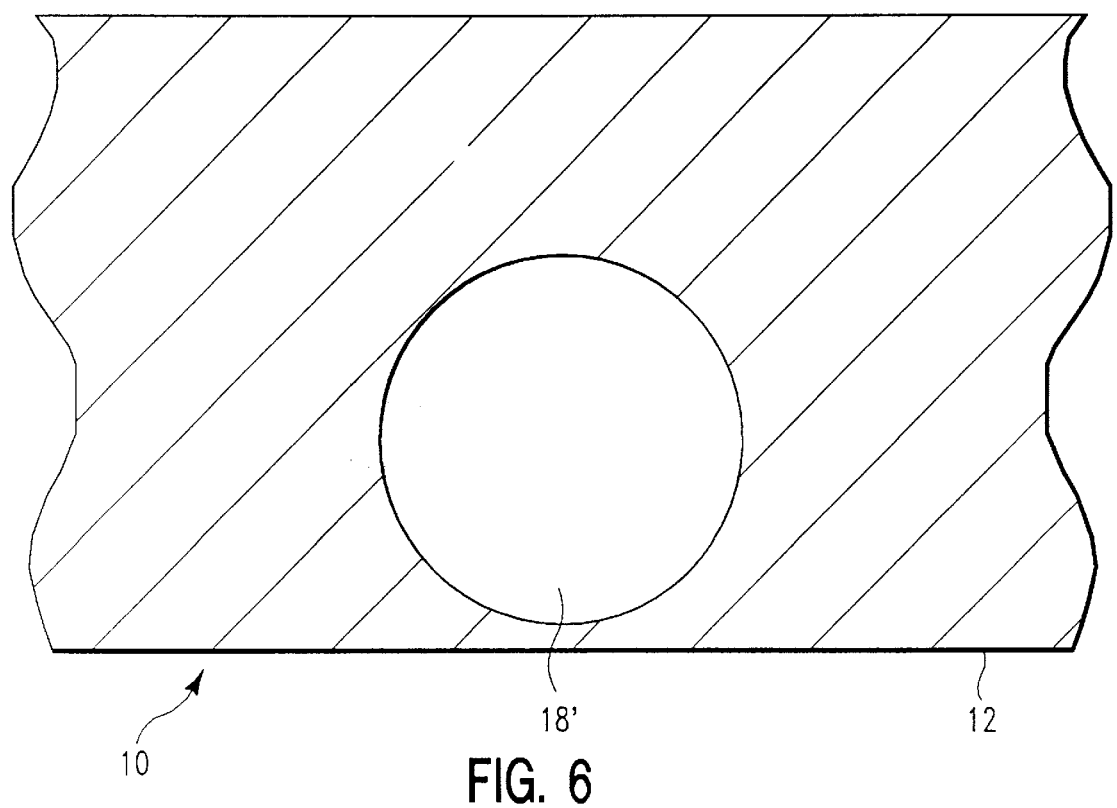
FIG. 6 is a partial cross section of the heatsink in which the heatpipe is integral with the heatsink; e.g., the heatpipe is a hole within the heatsink.

Groove 16 can also have parallel sidewalls 52 and 54 connected by arcuate wall 56, as shown in FIG. 6. In this form the heatpipe 18 is also provided within a thermally conductive adhesive 58 to transfer heat from the electronic module directly to heatpipe 18 and then to heatsink 10.

Figure 4:
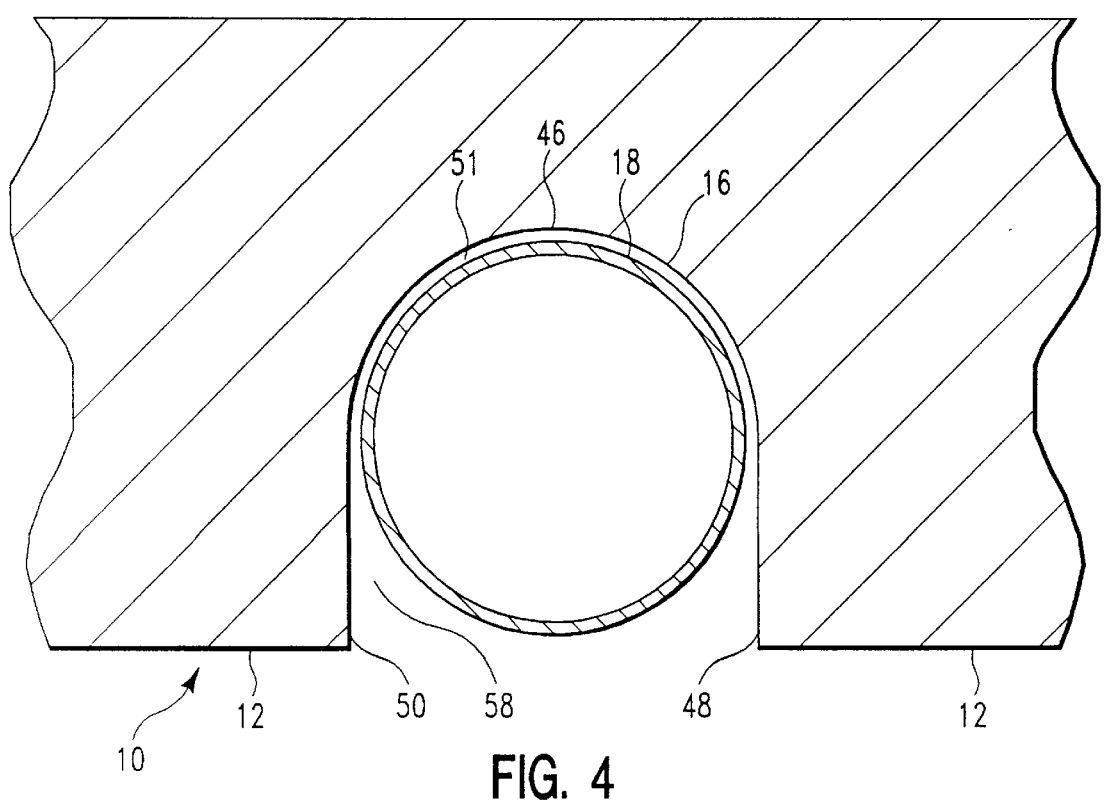
FIG. 4 is another partial cross section view of the heatsink showing a modification of the groove therein for the heatpipe according to the present invention.

The construction shown in FIG. 3 has a half circle with an inverted wedge shaped channel or groove extruded in the base of the heatsink. The heatpipe diameter, its tolerances, and the straightness of the heatpipe along with the extrusion processes forming channel 16 will determine the radius of the half circle and the angle of the inverted wedge. Similarly, for the C-shaped channel of FIG. 4, the channel depth and width are determined by adding the tolerance of the heatpipe diameter and the straightness and die-cast process tolerances to the nominal diameter of the heatpipe.

The present invention is particularly applicable where the area of base 12 of heatsink 10 is at least four times that of the area of contact between module 22 and heatsink 10. The larger heatsink facilitates a larger heat dissipation from a module, and the heatpipes allow the large heatsink to operate more efficiently by facilitating heat transfer within the heatsink for a more uniform temperature in all portions of the large heatsink.

In assembling the heatpipe and heatsink, the groove 16 (or 32, 34, 36, 38, 40) is extruded or die-cast in the heatsink, and the groove 16 is then cleaned with a cleaning solution, such as isopropyl alcohol. Groove 16 is formed in heatsink 10 during extrusion of the heatsink at no extra cost. Heatpipe 18 is also a very low cost part. Thus, the cost of the integrated heatpipe and heatsink is low.

Thereafter a measured thermally conductive adhsive 58 (i.e. Loctite 384) is inserted into groove 16 and the heatpipe 18 is inserted from an end (FIG. 3) or from the base (FIG. 4) depending on the type of groove. Alternatively, heatpipe 18 can be brazed or soldered into groove 16. In the next step, a thermally conductive double sided adhesive tape 20 may be placed over the groove to contain heatsink 18 within groove 16. Sized equal to the surface area of contact with module 22, adhesive tape 20 can also be used to bond heatsink 10 to module 22. Before adhesive 58 cures the assembly is inverted whereupon heatpipe 18 will drop so that its surface will extend to the surface plane 12 of the heatsink 18 squeezing the adhesive to fill the groove 16 and to preclude any air gap above the heatpipe 18 in the groove 16. In the preferred embodiment the heatpipe is made of copper and the heatsink from aluminum whereby the mismatch of their coefficients of expansion is not large enough to affect this assembly. The heatsink can also be made of copper, but at higher cost. Alternatively heatpipe 18 can be brazed or soldered into groove 16. Heatpipe 18' can also be fabricated as a hole within heatsink 10 located at or near the surface of base 12 which contacts module 22 as shown in FIG. 6. This improves thermal transfer by eliminating adhesive 58.

Having now set forth a description of this invention and a method of assembly thereof it is now desired to set forth the scope of protection afforded by these Letters Patent in the form of appended claims.

I claim:

1. An electronic assembly, comprising:
    a finned heat sink having a surface, a recess extending in a direction parallel to said surface, and a heat pipe in said recess;
    an electronic component having a first face and a second face different from said first face, said first face for external electrical connection to a next level of assembly, said next level of assembly being different from said heat sink; and
    said second face of said electronic component mounted to said surface of said heat sink wherein a first thermal path extends from said component to said heat pipe, said first thermal path extending through no more than a thin wall of said heat sink.

2. The assembly of claim 1, wherein said recess is a groove in said surface.

3. The assembly of claim 1, wherein said recess is a hole extending under said surface, there being a thin wall of said heat sink between said recess and said surface.

4. The assembly of claim 1, wherein a second thermal path extends from said component to said heat sink that does not go through said beat pipe.

5. The assembly of claim 1, further comprising a thermal adhesive between said heat pipe and said heat sink.

6. The assembly of claim 1, further comprising a plurality of said recesses and heat pipes, wherein thermal paths extend from said electronic component to each of said heat pipes through no more than a thin wall of said heat sink.

7. The assembly of claim 1, further comprising a thermal adhesive between said component and said heat pipe.

8. The assembly of claim 1, further comprising a thermal adhesive between said component and said beat sink.

9. The assembly of claim 2, wherein said first thermal path extends from said component to said heat pipe without going rough said heat sink.

10. The assembly of claim 3, wherein said first thermal path extends from said component across said thin wall to said heat pipe.

11. An electronic assembly, comprising:
    a funned heat sink having a surface, a recess in said surface, a heat pipe in said recess;
    an electronic component having a first face and a second face different from said first face, said first face for external ejectrical connection to a next level of assembly, said next level of assembly being different from said heat sink; and
    said second face of said electronic component mounted to said surface of said heat sink wherein a first thermal path extends from said component to said heat pipe, said first thermal path extending through no more than a thin wall of said heat sink, and a second thermal path extends from said component to said heat sink that does not go through said heat pipe.

12. The assembly of claim 11, wherein said recess extends in a direction parallel to said surface.

13. The assembly of claim 11, wherein said recess is a groove in said surface.

14. The assembly of claim 11, wherein said recess is a hole extending under said surface, there being a thin wall of said heat sink between said recess and said surface.

15. The assembly of claim 11, further comprising a thermal adhesive between said heat pipe and said heat sink.

16. The assembly of claim 11, further comprising a plurality of said recesses and heat pipes, wherein thermal paths extend from said electronic component to each of said heat pipes.

17. The assembly of claim 11, further comprising a thermal adhesive between said component and said heat pipe.

18. The assembly of claim 11, further comprising a thermal adhesive between said component and said heat sink.

19. The assembly of claim 13, wherein said first thermal path extends from said component to said beat pipe without going through said heat sink.

20. The assembly of claim 14, wherein said first thermal path extends from said component across said thin wall to said beat pipe.

* * * * *